United States Patent
Lin

(10) Patent No.: US 11,972,936 B2
(45) Date of Patent: Apr. 30, 2024

(54) SHIELDING DEVICE AND THIN-FILM-DEPOSITION EQUIPMENT WITH THE SAME

(71) Applicant: SKY TECH INC., Hsinchu County (TW)

(72) Inventor: Jing-Cheng Lin, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 371 days.

(21) Appl. No.: 17/564,771

(22) Filed: Dec. 29, 2021

(65) Prior Publication Data

US 2022/0411922 A1 Dec. 29, 2022

(30) Foreign Application Priority Data

Jun. 29, 2021 (TW) .................................. 110123823

(51) Int. Cl.
| | | |
|---|---|---|
| *H01J 37/34* | (2006.01) | |
| *C23C 14/34* | (2006.01) | |
| *C23C 14/54* | (2006.01) | |
| *H01J 37/32* | (2006.01) | |
| *C23C 16/44* | (2006.01) | |

(52) U.S. Cl.
CPC .......... *H01J 37/3447* (2013.01); *C23C 14/34* (2013.01); *C23C 14/54* (2013.01); *H01J 37/32651* (2013.01); *H01J 37/3441* (2013.01); *C23C 16/4405* (2013.01); *H01J 2237/332* (2013.01)

(58) Field of Classification Search
CPC ....... C23C 14/34; C23C 14/54; C23C 14/564; C23C 16/4405; C23C 16/4401; H01J 37/32651; H01J 37/3447; H01J 37/3441; H01J 2237/332; H01L 21/6719; H01L 21/68764; H01L 21/68785; H01L 21/68792
USPC ...................................... 204/298.11; 118/720
See application file for complete search history.

(56) References Cited

U.S. PATENT DOCUMENTS 11,482,403 B1 * 10/2022 Lin ................... H01J 37/32935
2022/0415633 A1 * 12/2022 Lin ......................... C23C 14/54

* cited by examiner

*Primary Examiner* — Rodney G McDonald
(74) *Attorney, Agent, or Firm* — Chun-Ming Shih; HDLS IPR SERVICES

(57) ABSTRACT

A thin-film-deposition equipment with shielding device, which includes a reaction chamber, a carrier, a shielding device and two optical sensors. The carrier and a portion of the shielding device are disposed within the reaction chamber. The shielding device includes two shield members, and at least one driver interconnecting to drive the two shield members to sway in opposite directions and switch between an open state and a shielding state. Each of the two shield members is disposed with a shield protrusion and a sensing region adjacent to each other. The shield protrusion is for shielding the sensing region from contaminants, thereby the optical sensors can accurately detect locations of the shield members.

20 Claims, 11 Drawing Sheets

SHIELDING DEVICE AND THIN-FILM-DEPOSITION EQUIPMENT WITH THE SAME

This non-provisional application claims priority claim under 35 U.S.C. § 119(a) on Taiwan Invention Application No. 110123823 filed on Jun. 29, 2021, the entire contents of which are incorporated herein by reference.

TECHNICAL FIELD

The present disclosure relates to a thin-film-deposition equipment, which includes a shielding device having shield members. Each of the shield members is disposed with shield protrusion and sensing region adjacent to each other, and the shield protrusion shields the sensing region from contaminants during a cleaning process, for sensors to accurately detect the sensing region.

BACKGROUND

A thin-film-deposition equipment, such as a chemical-vapor deposition (CVD), physical-vapor deposition (PVD) and the atomic-layer deposition (ALD) equipment, is commonly employed in manufacturing process of semiconductors, light-emitting diodes and displays, etc.

The thin-film-deposition equipment mainly includes a chamber and a substrate carrier. The substrate carrier is disposed within the chamber for carrying at least one substrate. To exemplify by PVD, a target is required to be disposed within the chamber, wherein the target faces the substrate on the substrate carrier. When performing PVD, noble gas or reactive gas is transferred into the chamber, then bias electricity is applied on the target and the substrate carrier respectively, also the substrate carried on by the substrate carrier is heated up.

The noble gas or reactive gas within the chamber transforms into ionized gas in effect of a high-voltage electric field, and then the ionized gas is attracted by the bias electricity to bombard the target. Thereby, atoms or molecules splashed from the target are attracted by the bias electricity on the substrate carrier, then be deposited on surface of the substrate and forms a thin film on the surface of the substrate.

After period of usage, an inner surface of the chamber may also be formed with thin film, and then a periodic cleaning is required to perform to the chamber, in order to prevent the waste thin film from dropping onto the substrate and causing contamination during the process of thin-film deposition. Moreover, surface of the target may be formed with oxide or other contaminant, therefore requires a periodic cleaning as well. Generally, a burn-in process is applied to bombard the target within the chamber by plasma ions, then to remove the oxides or contaminants on the surface of target.

To perform the abovementioned cleaning process, the substrate carrier and the substrate must be extracted or kept out, to prevent the removed contaminant from polluting the substrate carrier and the substrate, during the cleaning process.

SUMMARY

Generally, after a period of usage, the thin-film-deposition equipment is required to be cleaned, in order to remove the waste thin film within the chamber and the oxide or nitride on the target. During the cleaning process, some removed contaminant particles may turn to pollute the substrate carrier (hereafter as "carrier"), thus there is a need to keep out the substrate carrier from the removed contaminant. The present disclosure provides a shielding device and a thin-film-deposition equipment having the shielding device. The shielding device mainly employs a driver to rotate and swing two shield members in opposite rotational directions to approach or leave each other, such that to operate between a shielding state and an open state. Thereby, the shield members in shielding state can cover and shield the substrate carrier, to prevent the removed contaminant particles from polluting the substrate carrier during the process of cleaning the chamber or the target.

Each of the two shield members is disposed with a shield protrusion and a sensing region adjacent to each other. During a process of cleaning the reaction chamber, the driver swings the two shield members to approach each other, such that the two shield members come together to cover the carrier within a containing space, in order to prevent plasma applied for the cleaning or some removed waste contaminant from polluting the substrate carrier and/or the substrate thereon. Alternatively, during a process of performing the deposition, the driver swings the two shielding members to leave each other, such that to permit the process to proceed on the substrate within the reaction chamber.

The thin-film-deposition equipment includes at least two optical sensors for projecting optical beams on the sensing regions of the shield members, thereby to confirm the open state of the two shield members. Commonly during the cleaning process, the removed contaminants fall, deposit to the shield member and hence to form thin-film thereon, which may cause the optical sensors unable to accurately detect locations of the shield members. By virtue of the shield protrusions which shield the sensing regions, it is able to reduce the undesired thin film forming in the sensing regions, so as to facilitate detecting to confirm the open state of the shield members.

In one embodiment, the present disclosure provides a thin-film-deposition equipment, which includes a reaction chamber, a carrier, a shielding device and two distance sensors. The shielding device includes at least one driver, two shield members and two distance sensors. Also, the driver interconnects the two shield members, for respectively driving the two shield members to sway in opposite rotational directions and thereby to move between an open state and a shielding state.

In one embodiment, each of the two shield members is disposed with a reflective surface. When the two shield members are operated into the shielding state, each of the two distance sensors respectively projects an optical beam onto the reflective surface of a corresponding one of the two shield members, and also detects, measures a distance therebetween, such that to confirm whether the two shield members have been operated into the shielding state or not.

To achieve the abovementioned object, the present disclosure provides a thin-film-deposition equipment, which includes: a reaction chamber including a containing space, a carrier disposed within the containing space for carrying at least one substrate, a shielding device, and two optical sensors. In more detail, the shielding device includes: a first shield member disposed within the containing space and including a first shield protrusion and a first sensing region adjacent to each other, wherein the first shield protrusion and the first sensing region are disposed on a surface which does not face the carrier; a second shield member disposed within the containing space and including a second shield protrusion and a second sensing region adjacent to each other, wherein the second shield protrusion and the second sensing region are disposed on a surface which does not face the carrier; and at least one driver interconnecting the first shield member and the second shield member and respectively driving and swinging the first shield member and the second shield member to move in opposite directions so as to switch between a shielding state and an open state. In the shielding state, the first shield member and the second shield member approach each other, and the first shield member and the second shield member define an open space therebetween. The two optical sensors are disposed on the reaction chamber, for respectively detecting the first sensing region of the first shield plate and the second sensing region of the second shield plate, and thereby to confirm whether the first shield member and the second shield member are operated into the open state or not.

The present disclosure also provides a shielding device adapted to a thin-film-deposition equipment, which includes: a first shield plate provided with a first shield protrusion and a first sensing region adjacent to each other, wherein the first shield protrusion and the first sensing region are disposed on a surface which does not face the carrier; a first connecting arm for carrying the first shield plate; a second shield plate is provided with a second shield protrusion and a second sensing region adjacent to each other, wherein the second shield protrusion and the second sensing region are disposed on a surface which does not face the carrier; a second connecting arm for carrying the second shield plate; and at least one driver interconnecting the first shield plate and the second shield plate and respectively via the first connecting arm and the second connecting arm, thereby to respectively drive and swing the first shield plate and the second shield plate to move in opposite directions so as to switch between a shielding state and an open state. In the shielding state, the first shield plate and the second shield plate approach each other, and the first shield plate and the second shield plate define an open space therebetween.

Also, the aforementioned shielding device and thin-film-deposition equipment may further include a first distance sensor and a second distance sensor. The first connecting arm is disposed with a first reflective surface, while the second connecting arm is disposed with a second reflective surface. The first distance sensor is disposed on the reaction chamber and configured to project a first optical beam onto the first reflective surface and the first connecting arm; and the second distance sensor is disposed on the reaction chamber and configured to project a second optical beam onto the second reflective surface and the second connecting arm.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
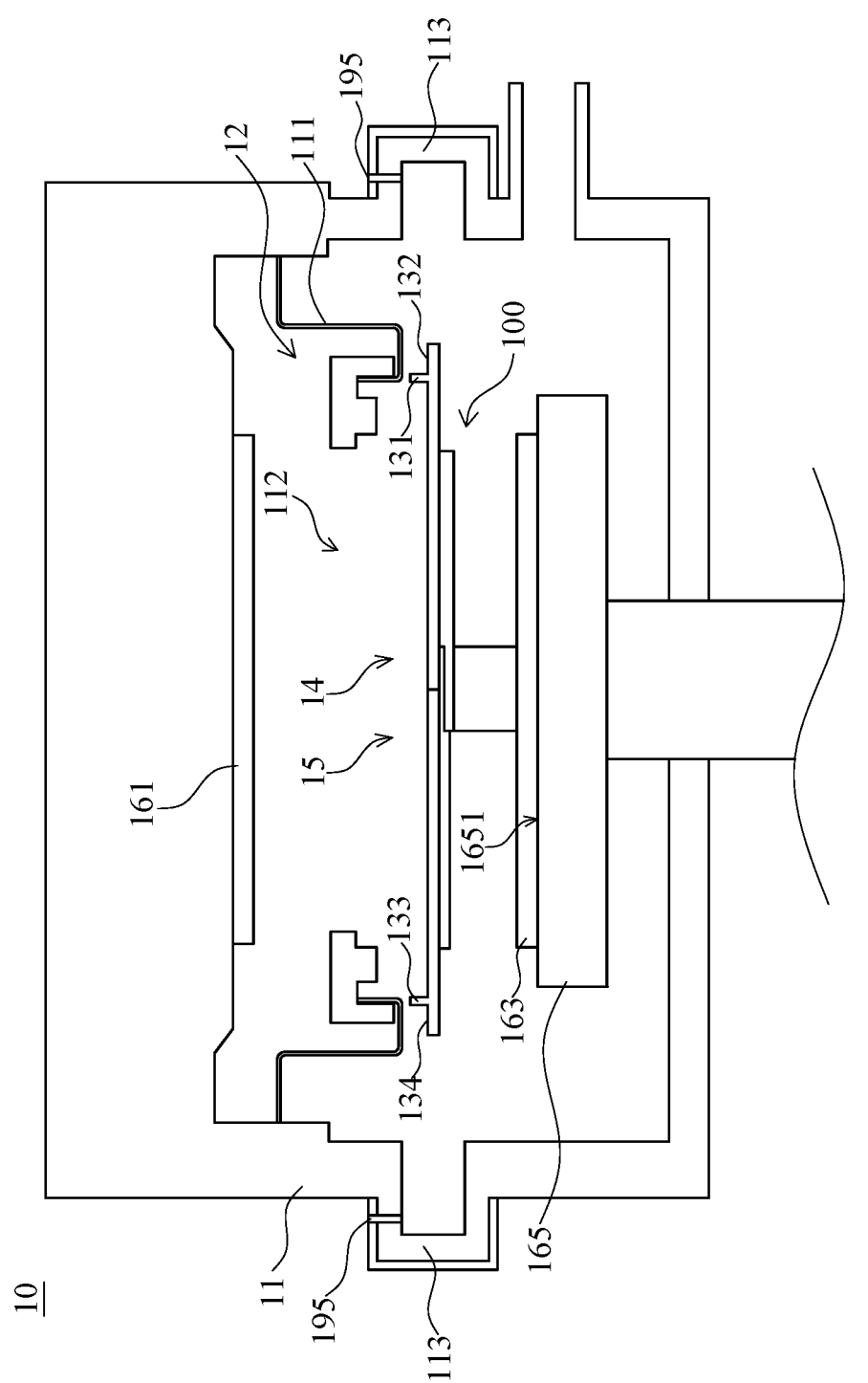
FIG. 1 is a cross-sectional view illustrating a thin-film-deposition equipment with shielding device which is operated into a shielding state, according to one embodiment of the present disclosure.

Referring to FIG. 1, which is a cross-sectional view illustrating of a thin-film-deposition equipment 10 for detecting wherein a shielding device 100 is operated in a shielding state, according to one embodiment of the present disclosure. As shown in the drawing, the thin-film-deposition equipment 10 mainly includes a reaction chamber 11, a carrier 165 and a shielding device 100. The reaction chamber 11 includes a containing space 12 for containing the carrier 165 and a portion of the shielding device 100.

The carrier 165 is disposed within the containing space 12 of the reaction chamber 11, and the carrier 165 includes a carrying surface 1651 for carrying at least one substrate 163. In this embodiment, the thin-film-deposition equipment 10 is exemplified as a physical-vapor deposition chamber, such that, the reaction chamber 11 is disposed within a target 161 and includes the target 161 facing the carrier 165. Specifically, the target 161 may be disposed on a ceiling surface of the reaction chamber 11 to face the carrier 165 and/or the substrate 163 carried thereon within the containing space 12, for example.

Figure 2:
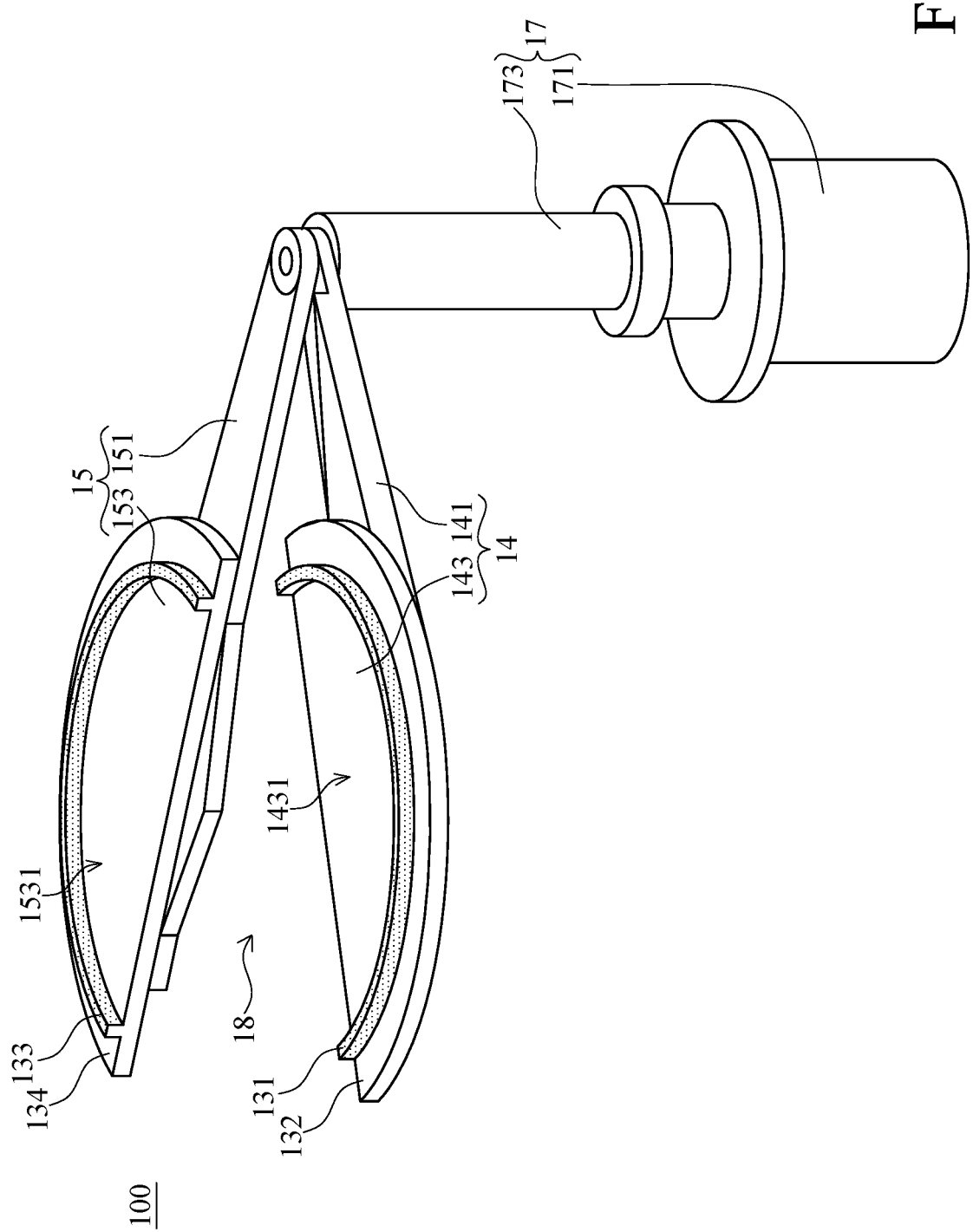
FIG. 2 is a perspective view illustrating the shielding device which is operated into an open state, according to one embodiment of the present disclosure.
Figure 3:
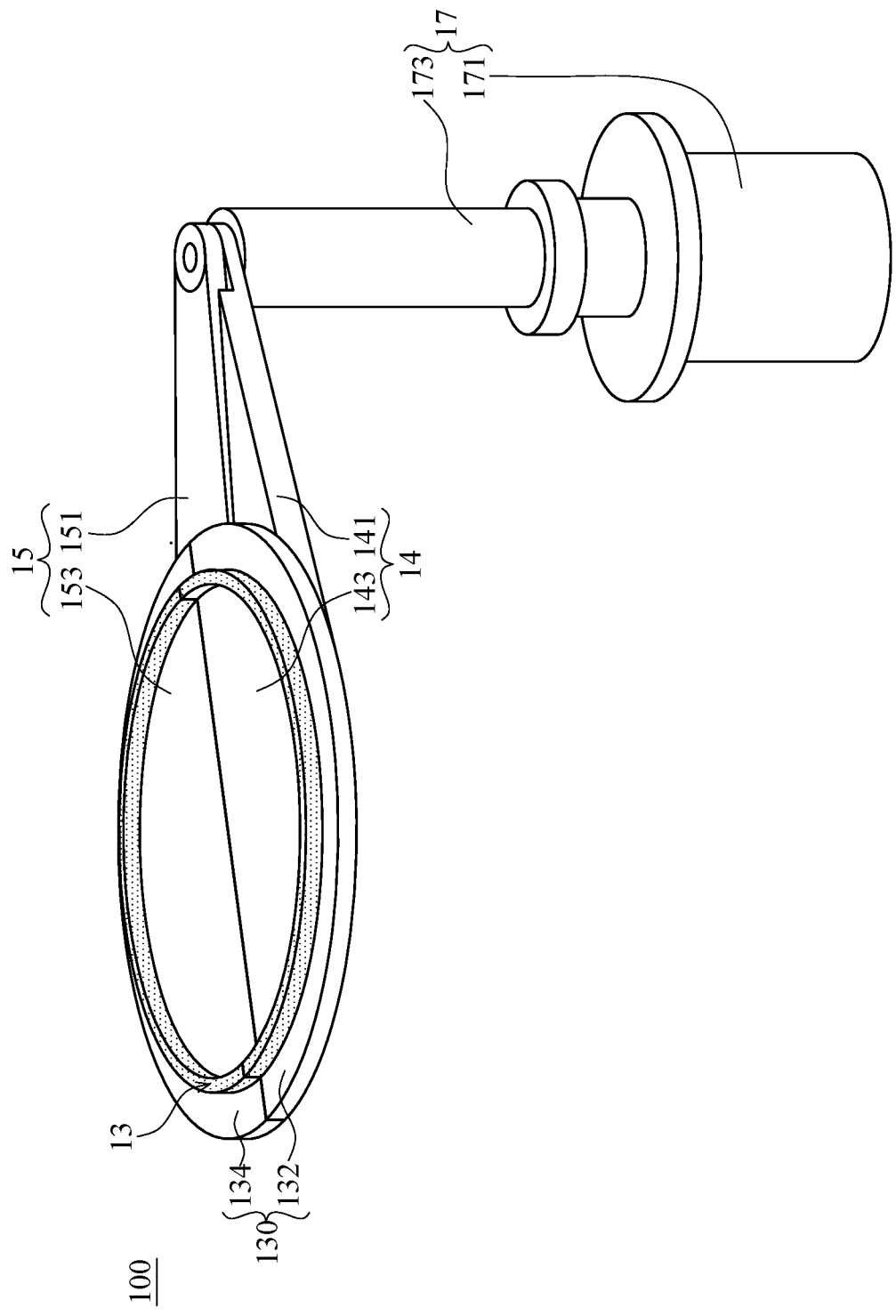
FIG. 3 is a perspective view illustrating the shielding device which is operated into the shielding state, according to one embodiment of the present disclosure.

Referring to FIG. 2 and FIG. 3, the shielding device 100 includes a first shield member 14, a second shield member 15 and a driver 17. The two shield members 14, 15 are disposed within the containing space 12. The driver 17 is power-transmittably interconnects the first shield member 14 and the second shield member 15, so as to drive, swing the first shield member 14 and the second shield member 15 in opposite directions (rotational directions), to have the two shield members 14, 15 swaying toward or away from each other simultaneously, about an axle of the driver 17.

Thereby, the driver 17 can drive and swing the two shield members 14, 15 away from each other into an open state and to define an open space 18 therebetween, for the thin-film-deposition equipment 10 to employ process gas to bombard the target 161 and to perform a deposition process to the substrate 163 carried by the carrier 165, within the containing space 12. In an opposite manner, the driver 17 can drive and swing the two shield members 14, 15 toward each other into a shielding state, and to form a whole round shield to cover, shield the carrier 165 and/or the substrate 163 thereon, for the thin-film-deposition equipment 10 to perform a cleaning process, wherein the two shield members 14, 15 together cover the carrier 165 to prevent removed contaminants from polluting the carrier 165, as shown in FIG. 1, FIG. 3, FIG. 6 and FIG. 7.

As shown in FIGS., in one embodiment of the present disclosure, the first shield member 14 includes a first shield plate 143, and a first connecting arm 141 for carrying the first shield plate 143. In the other hand, the second shield member 15 includes a second shield plate 153, and a second connecting arm 151 for carrying the second shield plate 153. Specifically, the driver 17 power-transmittably interconnects the first shield plate 143 and the second shield plate 153 respectively via the first connecting arm 141 and the second connecting arm 151, such that to drive, swing the first shield plate 143 and the second shield plate 153 in the opposite directions, thereby to operate and switch the first shield plate 143 and second shield plate 153 thereon between the open state and the shielding state.

The first shield plate 143 of the first shield member 14 and the second shield plate 153 of the second shield member 15 are formed as plates, and includes a first top surface 1431 which does not face the carrier 165 (preferable to face the target 161 as shown in FIG. 1, for example). The first top surface 1431 is disposed with a first shield protrusion 131 and defined with a first sensing region 1320. The first shield protrusion 131 and the first sensing region 132 are adjacent to each other. As shown in FIG. 1~FIG. 3, in one embodiment, the first sensing region 132 is disposed more external or more radially-external than the first shield protrusion 131 is, on the first top surface 1431. For example, when the first shield plate 143 is formed as a half-round plate, therewith, the first shield protrusion 131 is formed proximately half-circular or C-shaped. Similar to the first shield plate 143, the second shield plate 153 also includes a second top surface 1531, which also does not face the carrier 165 (preferably disposed to face the target 161 for example), and which is also formed with a second shield protrusion 133 and a second sensing region 134. The second sensing region 134 is disposed more external or more radially-external than the second shield protrusion 133 is.

Figure 5:
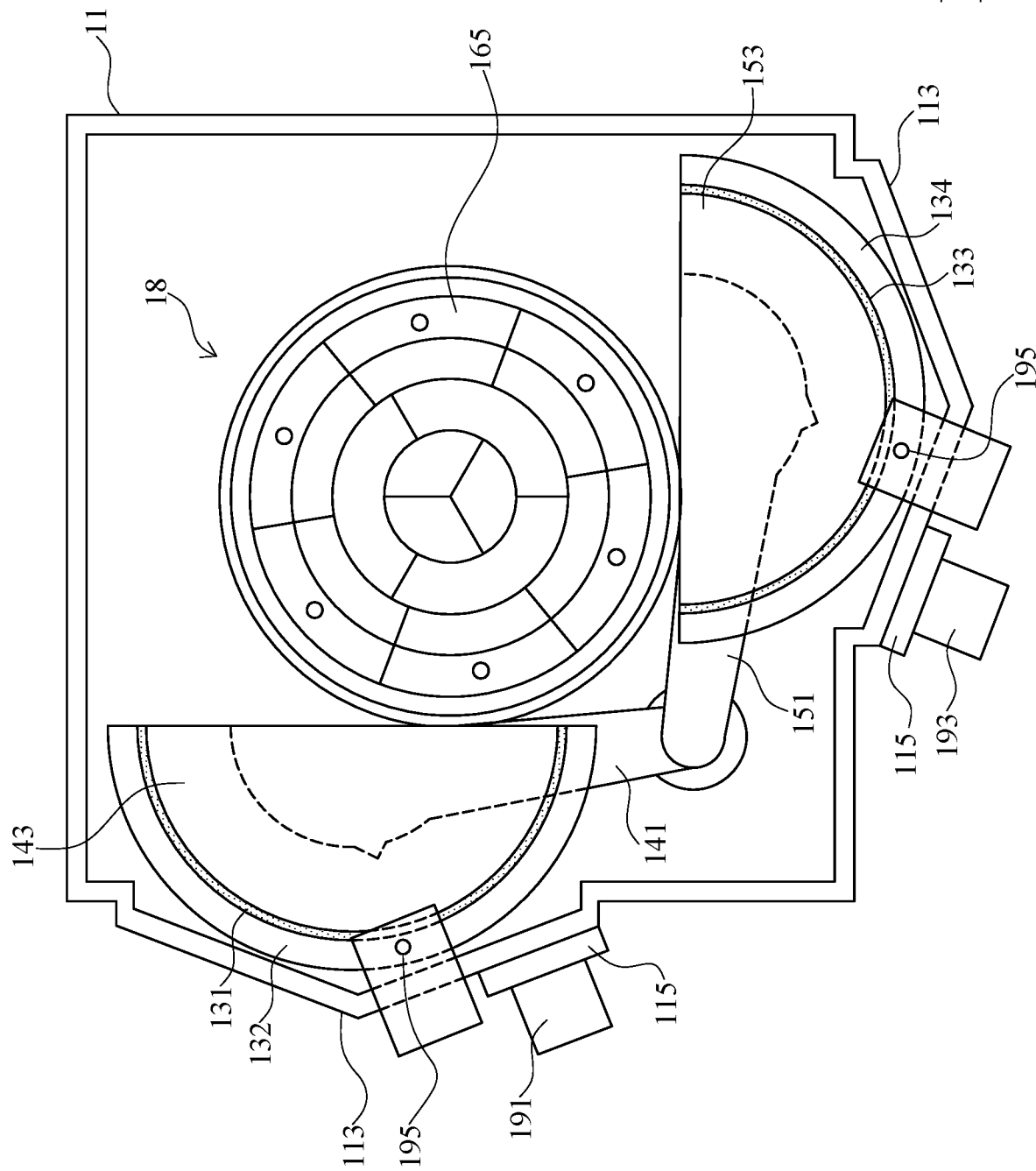
FIG. 5 is a top cross-sectional view illustrating the thin-film-deposition equipment which includes the shielding device operated into the open state, according to one embodiment of the present disclosure.
Figure 6:
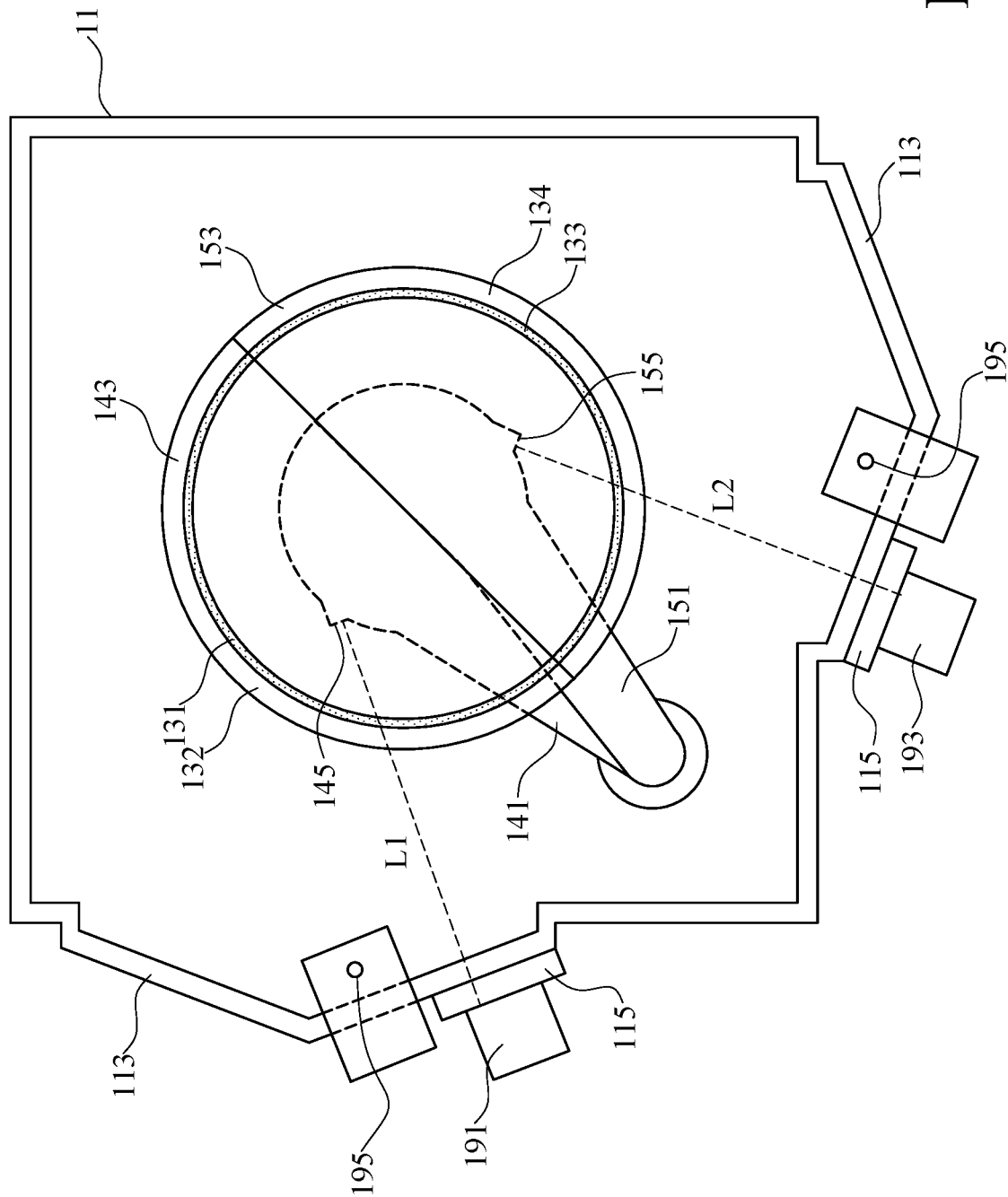
FIG. 6 is a top cross-sectional view illustrating the thin-film-deposition equipment which includes the shielding device operated into the shielding state, according to one embodiment of the present disclosure.

As shown in FIG. 1, FIG. 5 and FIG. 6, the reaction chamber 11 includes two sensor chambers 113 which are connected to and which protrude from two sides of the reaction chamber 21 respectively. Each of the sensor chambers 113 is formed with a hollow sensing space therein which is spatially and fluidly connected to the containing space 12 of the reaction chamber 11. Moreover, each of the sensor chambers 113 is disposed with an optical sensor 195, such as range finder, reflective-object sensor, or through-beam sensor, etc., each of which includes an optical emitter for emitting, throwing optical signal, and an optical receiver for receiving the optical signal form the optical emitter.

As shown in FIG. 1, FIG. 2 and FIG. 5, each of the optical sensors 195 within the sensor chambers 113 is for respectively detecting, and hence to confirm that the first shield plate 143 of the first shield member 14 and the second shield plate 153 of the second shield member 15 have been operated into the open state. For example, as the two shield members 143, 153 separate and respectively enter the sensor chambers 113 (partially in this embodiment) to intersect the optical signals emitted from the optical emitters of the optical sensors 195 therein, the optical signals are projected onto the sensing regions 132, 134 then reflected or scattered back for the optical receivers of the optical sensors 195 to receive, thereby to confirm that the two shield members 14, 15 are in the open state. Also to mention that, each of the sensor chambers 113 includes a height (thickness in vertical direction of FIG. 1) shorter than that of the reaction chamber 21, such that to facilitate mounting the optical sensors 195 from outside of the reaction chamber 11.

As shown in FIG. 1, FIG. 3 and FIG. 6, during the process of the reaction chamber 11 and/or the target 161, the removed contaminants or certain particles may fall and deposit on the first shield plate 143 and the second shield plate 153, so as to form undesired thin films thereon, and such that the optical sensors 195 are unable to detect the open state of the first shield member 14 and the second shield member 15 accurately. Thus, according to the present disclosure, the two shield protrusions 131, 133 are disposed on the top surfaces 1431, 1531 of the two second shield plates 143, and are adjacent to the sensing regions 132, 134 at the external side; thereby, the first and second shield protrusions 131, 133 respectively shield, protect the first and second sensing regions 132, 134 from forming the thin films, during the cleaning process.

Moreover, as shown in FIG. 2, FIG. 3, FIG. 5 and FIG. 6, the first shield protrusion 131 and the second shield protrusion 133 may be C-shaped or half-circular as aforementioned. When the first and second shield plates 143, 153 are operated into the shielding state to form the round shield, the two shield protrusions 131, 133 come together and form a fully circular, annular shield wall 13. Meanwhile, at the radially-external side of the annular shield wall 13, the first and second sensing regions 132, 134 also come together and form an annular sensing region 130. The annular shield wall 13 protruding from the top surface of the round shield and toward the target 161; the annular shield wall 13 does not only protect the annular sensing region 130, but also improves a coverage performance of the round shield formed by the two shield members 143, 153.

In more detail, a manner of the first shield member 14 and the second shield member 15 being operated into the shielding state, which is defined as the first shield plate 143 of the first shield member 14 and the second shield plate 153 of the second shield member 15 continue to approach each other, until a distance between the two shield members 143, 153 is less than a threshold value, such as 1 millimeter (mm). To be specific, the first shield plate 143 and the second shield plate 153 do not actually contact each other, such that to avoid a collision or friction therebetween, which may create some wear-off particles therefrom to pollute the containing space 12 of the reaction chamber 11 and/or the carrier 165 therein. Therewith, the two shield protrusions 132, 134 thereon are also configured to maintain a distance based on the above-mentioned threshold value, so as to prevent a collision therebetween in the shielding state.

Figure 7:
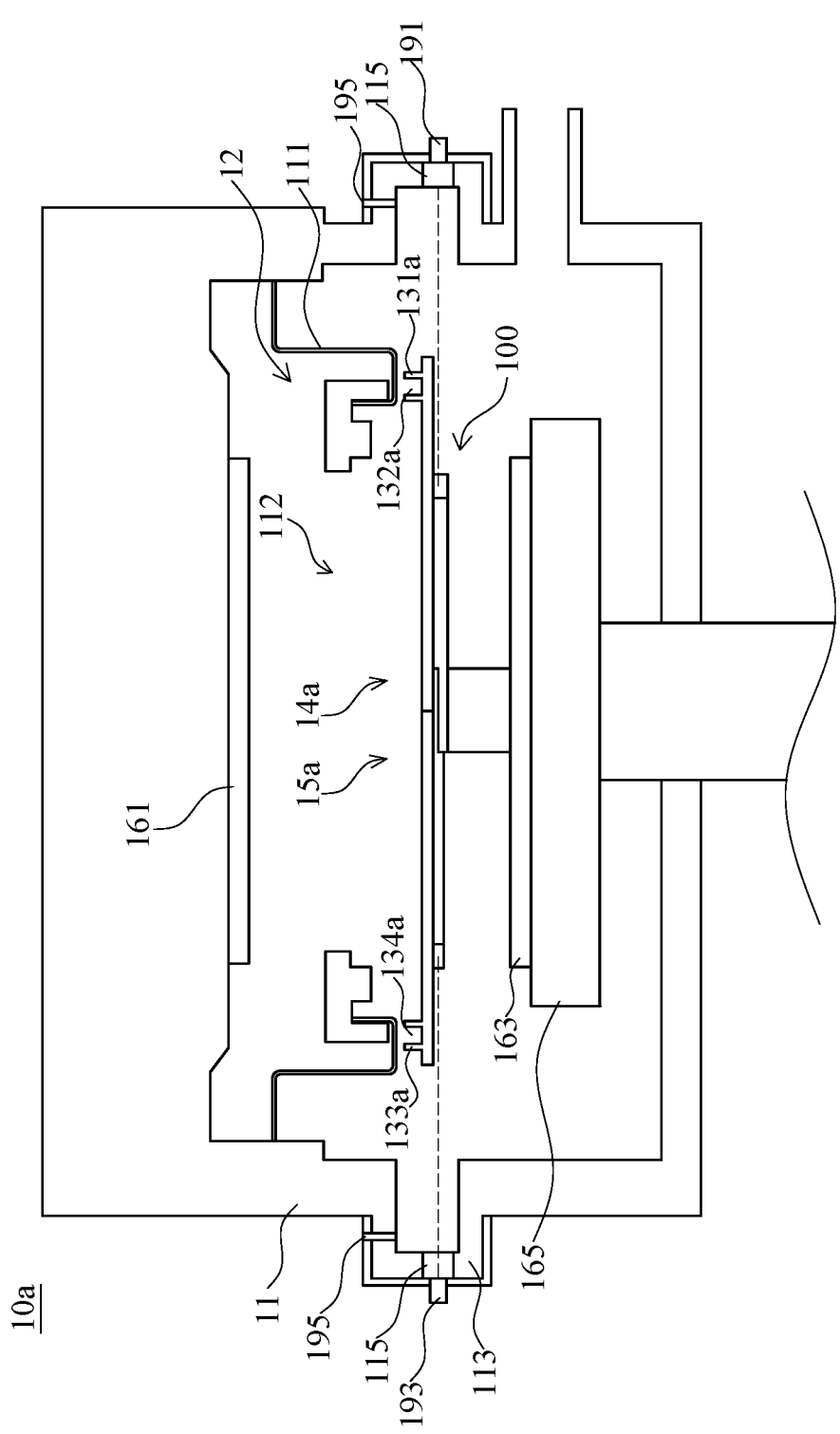
FIG. 7 is a cross-sectional view illustrating the thin-film-deposition equipment which is operated into the shielding state, according to another embodiment of the present disclosure.
Figure 8:
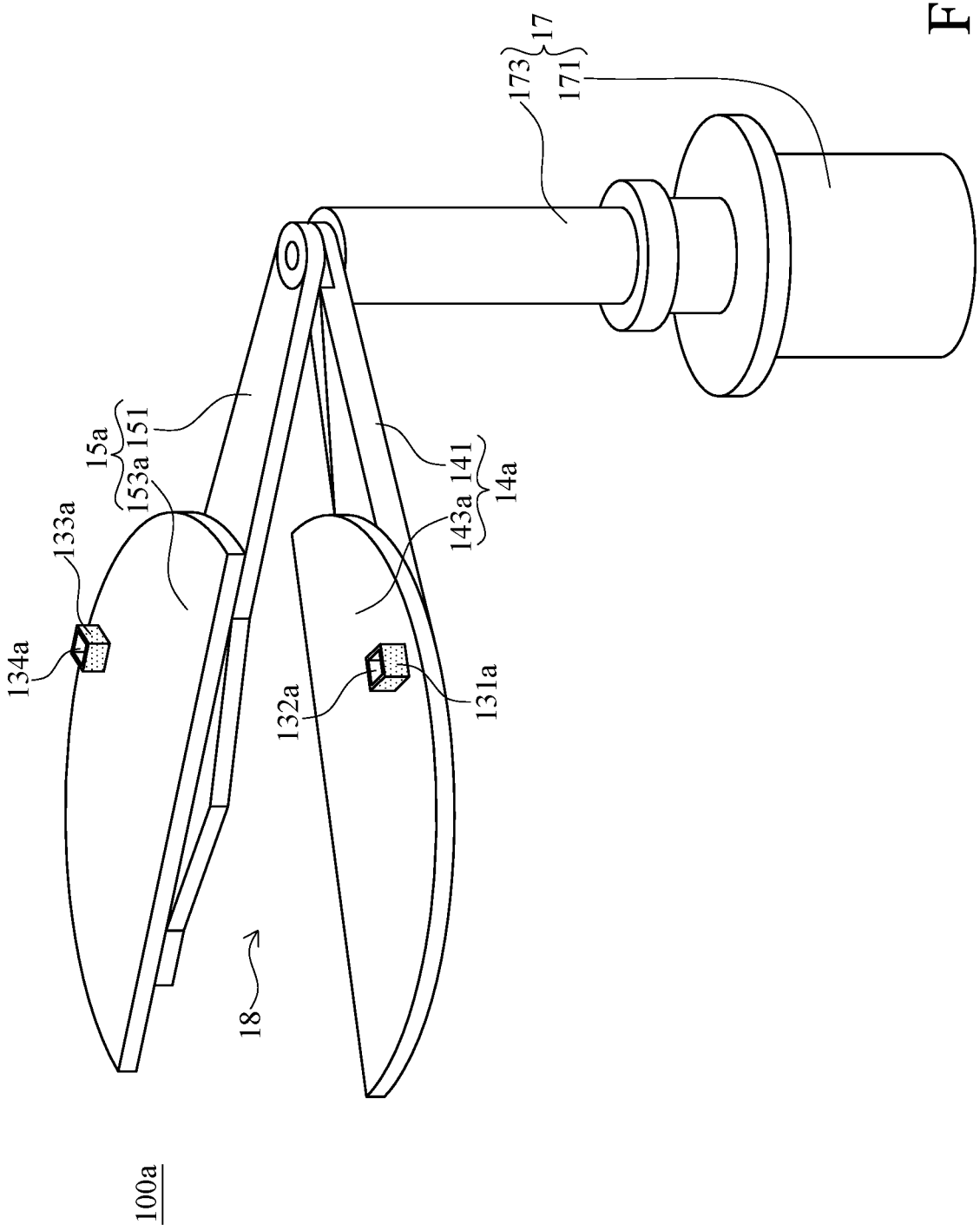
FIG. 8 is a perspective view illustrating the shielding device which is operated into the open state, according to another embodiment of the present disclosure.

Also, in other embodiments as shown in FIG. 7 and FIG. 8, each of the first and second shield protrusions 131a, 133a may be formed as a polygonal or tubular surrounding wall, such as to have a closed, loop-shaped cross-section, and to respectively surround a corresponding one of the first and second sensing regions 132a, 134a. Thereby, the sensing regions 132a, 134a are arranged at relatively specific locations on the shield members 143a, 153a.

Figure 9:
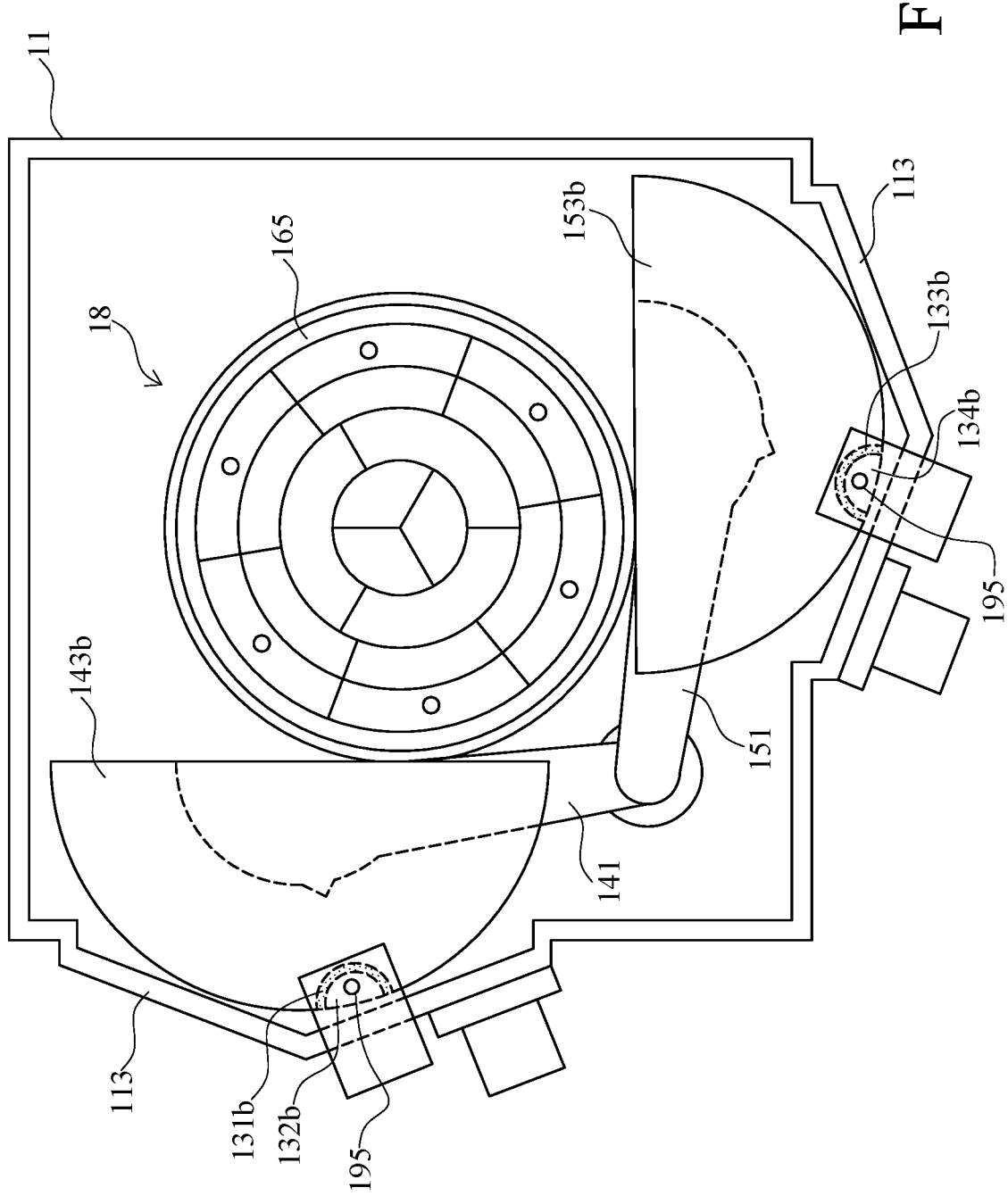
FIG. 9 is a top cross-sectional view illustrating the thin-film-deposition equipment which includes the shielding device operated into the open state, according to yet another embodiment of the present disclosure.

For more, in another embodiment as shown in FIG. 9, each of the two shield protrusions 131b, 133b may be formed with an opened cross-section, such as a C-shaped or U-shaped protrusion, and define the sensing region 132b, 134b therein. In more detail, the first shield protrusions 131b includes the C-shaped or U-shaped cross-section opened toward and connected to an external edge of the first shield plate 143b (distal to the second shield plate 153), while the second shield protrusions 133b includes the C-shaped or U-shaped cross-section opened toward and connected to an external edge of the second shield plate 153b (distal to the first shield plate 143).

In one embodiment of the present disclosure as shown in FIG. 1, the containing space 12 of the reaction chamber 11 may be disposed with a tubular blocking member 111, which includes one end connected to the ceiling surface of the reaction chamber 11, and another end formed with an opening 112. Such that, when the carrier 165 is driven by an elevating mechanism (not shown) to approach the target 161, the carrier 165 also enters the opening 112 or contacts the blocking member 111. Thereby, the reaction chamber 11, the carrier 165 and the blocking member 111 together define a reactive space within the containing space 12, for forming the thin film on the substrate within the reactive space, so as to prevent the blew-off particles of the target 161 from spreading out of the reactive space and forming undesired thin film outside.

In the opposite manner, as shown in FIG. 1 and FIG. 8, the driver 17 can drive, swing the first shield member 14 and the second shield member 15 to approach each other and move into the shielding state, to form the whole round shield between the target 161 and the carrier 165. At this moment, the round shield and the blocking member 111 together can define a cleaning space within the containing space 12, wherein the cleaning space and the aforementioned reactive space have partially or completely spatial overlap. A burn-in process may be performed within the cleaning space, to clean the target 161, the ceiling surface of the reaction chamber 11 and/or an inside of the blocking member 111, and to remove oxides, nitrides or other contaminants on the target 161, also to remove undesired, waste thin film within the reaction chamber 11 and/or the blocking member 111.

When the first shield plate 143 and the second shield plate 153 are in the shielding state, the annular shield wall 13 is positioned under or around the blocking member 111, also, the annular shield wall 13 is configured to have an inner diameter equal to or larger than a diameter of the opening 112 of the blocking member 111, so as to effectively keep the contaminants within a radial-internal side of the round shield (formed by the two shield members 143, 153) from contacting the sensing circular 130.

In one embodiment of the present disclosure as shown in FIG. 2 and FIG. 3, the driver 17 includes at least one motor 171 and a shaft seal 173. The motor 171 is power-transmittably connected to the first shield member 14 and the second shield member 15 via the shaft seal 173. The shaft seal 173 may be a common rotary-shaft seal or a magnetic liquid rotary sealing, for maintain a vacuum condition within the reaction chamber 11.

Figure 4:
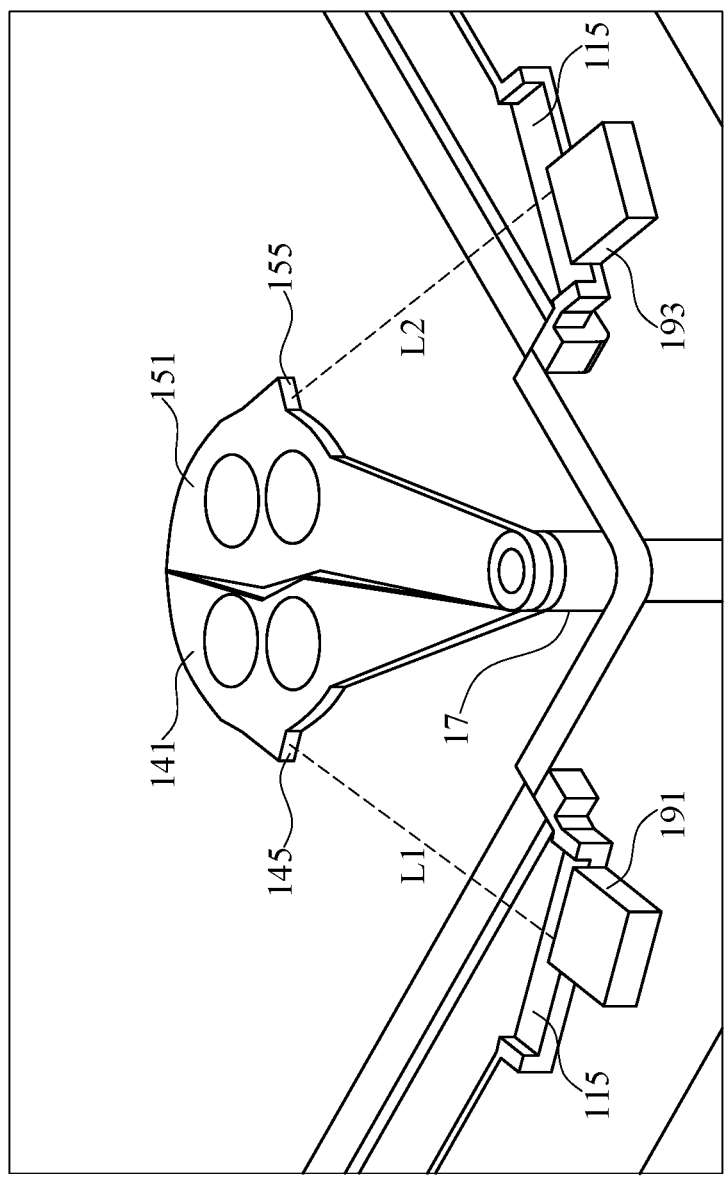
FIG. 4 is a fragmentary perspective view illustrating the shielding device which is operated into the shielding state and detected by distance sensors, according to one embodiment of the present disclosure.

In an advanced embodiment as shown in FIG. 1, FIG. 4 and FIG. 6, the thin-film-deposition equipment 10 includes the first shield member 14 disposed with a first reflective surface 145, and includes the second shield member 15 disposed with a second reflective surface 155. Furthermore, the thin-film-deposition equipment 10 includes a first distance sensor 191 and a second distance sensor 193 disposed on the reaction chamber 11, for respectively detecting the first shield member 14 and the second shield member 15 to confirm the shielding state thereof. In practical use, the first distance sensor 191 and the second distance sensor 193 may be optical rangefinders.

The first distance sensor 191 is disposed on side of the first shield member 14, wherein the first distance sensor 191 emits and projects a first optical beam (L1) onto the first shield member 14. In practical use, a position of the first distance sensor 191 may be configured, to have the first optical beam (L1) thereof projected right on the first reflective surface 145 of the first shield member 14 when the first shield member 14 is operated into the shielding state. At this moment, the first optical beam (L1) of the first distance sensor 191 is projected by an optical emitter thereof and perpendicularly projected on the first reflective surface 145 (parallel to a normal line of the surface 145), and then reflected by the first reflective surface 145 and returns to an optical receiver of the first distance sensor 191. Such that, the first distance sensor 191 can measure a distance between the first shield member 14 and the first distance sensor 191 itself, by such as estimating a time duration from the projecting of the first optical beam (L1) to the return of the first optical beam (L1), or a reflective angle between the projected first optical beam (L1) and the reflected first optical beam (L1), etc. Thereby, the first distance sensor 191 can confirm that the first shield member 14 has been operated into the shielding state when the distance substantially matches to a preset value corresponding to the shield state.

Similar to the first distance sensor 191, the second distance sensor 193 is disposed on side of the second shield member 15, and projects a second optical beam (L2) onto the second reflective surface 155 of the second shield member 15. At this moment, the second optical beam (L2) of the second distance sensor 193 is perpendicularly projected on the second reflective surface 155, and then reflected by the second reflective surface 155 back to the second distance sensor 193. Such that, the second distance sensor 193 can measure a distance between the second shield member 15 and the second distance sensor 193 itself by the reflected second optical beam (L2), and hence to confirm that the second shield member 15 has been operated into the shielding state.

In one embodiment of the present disclosure, as shown in FIG. 5 and FIG. 6, the reaction chamber 11 may be disposed with two transparent windows 115, which respectively face the first distance sensor 191 and the second distance sensor 193 mounted outside of the reaction chamber 11, and which allow the two distance sensors 191, 193 to respectively project the optical beam (L1, L2) therethrough and into the containing space 12 of the reaction chamber 11 for detecting the two shield members 14, 15 within.

Figure 10:
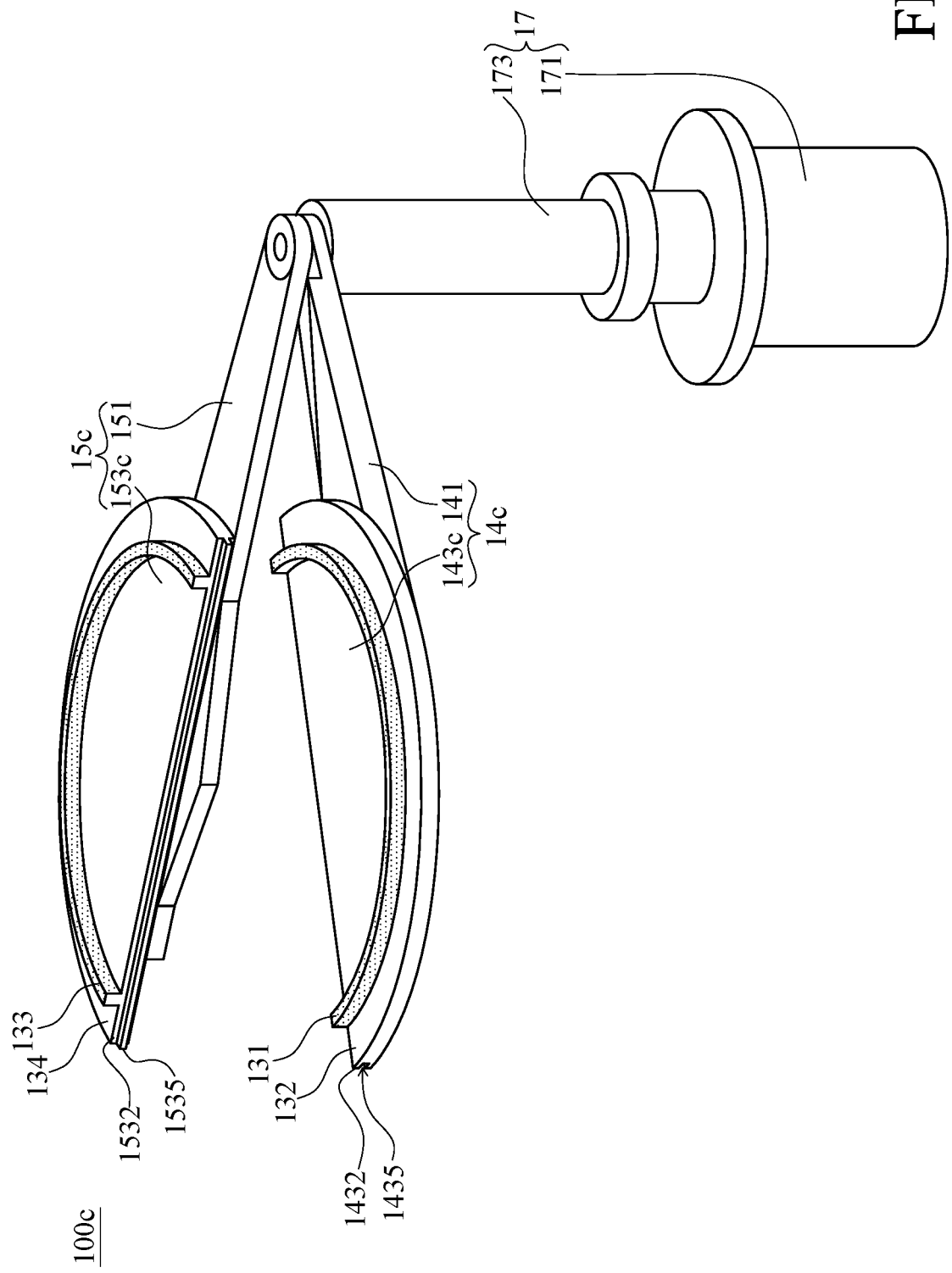
FIG. 10 is a perspective view illustrating the shielding device which is operated into the open state, according to an additional embodiment of the present disclosure.
Figure 11:
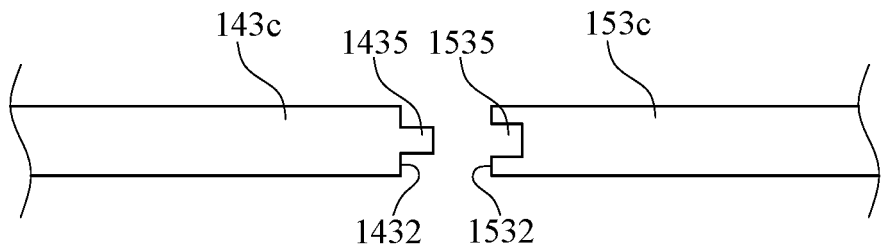
FIG. 11 is a fragmentary cross-sectional view illustrating a first shield plate and a second shield plate of the shielding device which are separate from each other, according to an additional embodiment of the present disclosure.
Figure 12:
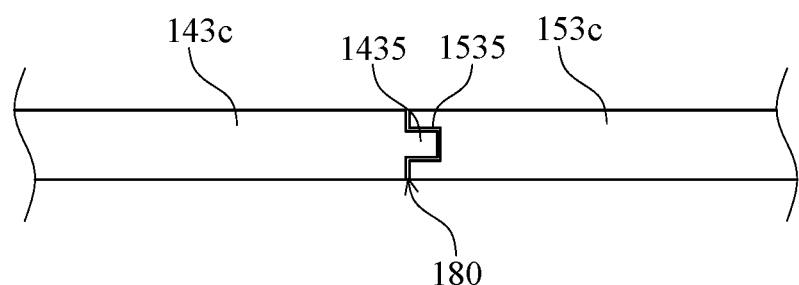
FIG. 12 is a fragmentary cross-sectional view illustrating the first shield plate and the second shield plate of the shielding device which are in the shielding state, according to a different embodiment of the present disclosure.
Figure 13:
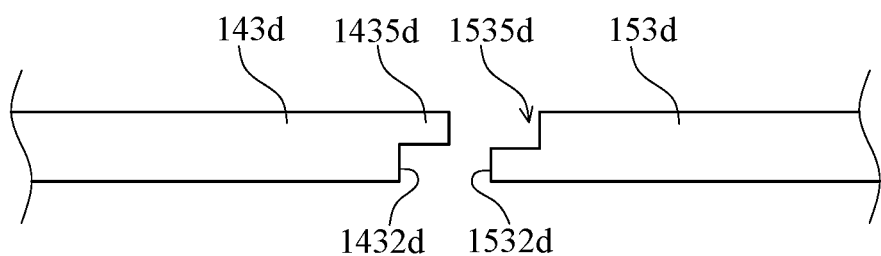
FIG. 13 is a fragmentary sectional view illustrating the first shield plate and the second shield plate which are separate from each other, according to one more different embodiment of the present disclosure.

Referring to FIG. 10, FIG. 11, FIG. 12 and FIG. 13, wherein FIG. 10 is a perspective view illustrating the shielding device 100c of the thin-film-deposition equipment which is in the open state, FIG. 11 is a sectional view illustrating the first shield plate 143c and the second shield plate 153c of the shielding device 100c which are separate from each other, FIG. 12 is a sectional view illustrating the first shield plate 143c and the second shield plate 153c of the shielding device 100c which are in the shielding state, and FIG. 13 is a sectional view illustrating the first shield plate 143c and the second shield plate 153c of the shielding device 100c which are separate from each other, according to another embodiment of the present disclosure. In an additional embodiment, the first shield plate 143c of the first shield member 14c includes a first inner surface 1432 which faces the second shield plate 153c of the second shield member 15c in shielding state, and which may be formed with at least one protrusion 1435. In the other hand, the second shield plate 153c includes a second inner surface 1532 which faces the first inner surface 1431 of the first shield plate 143c in the shielding state, and which is formed at least one cavity 1535 corresponding to the protrusion 1435 on the first inner surface 1432. Also to mention, the protrusion 1435 is formed slightly smaller than the cavity 1535.

As shown in FIG. 12, when the first shield plate 143c and second shield plate 153c are operated into the shielding state, the first inner surface 1432 and the second inner surface 1532 are configured to maintain a gap space 180 (with a distance less than the aforementioned threshold value) therebetween. Therewith, the protrusion 1435 of the first inner surface 1432 enters the cavity 1535 of the second inner surface 1532, wherein the protrusion 1435 and cavity 1535 also maintain the gap space 180. By virtue of such structure, during the cleaning process, the shielding device 100c is able to block the removed contaminants form passing through the gas space 180 between the two shield members 143c, 153c operated into the shielding state, therefore to improve the coverage performance.

As shown in FIG. 11 and FIG. 12, the protrusion 1435 is positioned at middle of the first inner surface 1432 on the first shield plate 143c, while the cavity 1535 is also positioned at middle of the second inner surface 1532 on the second shield plate 153c. However, in another different embodiment as shown in FIG. 13, the protrusion 1435d may be positioned at an upper portion of the first inner surface 1432d of the first shield plate 143d, and the cavity 1535d may also be positioned at a upper portion of the second inner surface 1531d, it is only sufficient to have the protrusion entering the cavity for a better coverage when in the shielding state.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

I claim:

1. A thin-film-deposition equipment with shielding device, comprising:
    a reaction chamber comprising a containing space;
    a carrier disposed within the containing space and including a carrying surface for carrying at least one substrate thereon; and
    a first shield member disposed within the containing space and including a first shield protrusion and a first sensing region, wherein the first shield protrusion and the first sensing region are disposed adjacent to each other on a surface of the first shield member which does not face the carrier;
    a second shield member disposed within the containing space and including a second shield protrusion and a second sensing region, wherein the second shield protrusion and the second sensing region are disposed adjacent to each other on a surface of the second shield member which does not face the carrier;
    at least one driver interconnecting the first shield member and the second shield member to respectively drive and swing the first shield member and the second shield member in opposite directions and switch between an open state and a shielding state, wherein in the shielding state, the first shield member and the second shield member approach each other to shield the carrier; and wherein in the open state, the first shield member and the second shield member define an open space therebetween; and
    at least two optical sensors disposed on the reaction chamber, for respectively detecting the first sensing region of the first shield member and the second sensing region of the second shield member and thereby to confirm that the first shield member and the second shield are operated into the open state.

2. The thin-film-deposition equipment according to claim 1, wherein the first shield member includes a first connecting arm and a first shield plate disposed with the first shield protrusion and first sensing region; the at least one driver is connected to the first shield plate via the first connecting arm; the second shield member includes a second connecting arm, and a second shield plate disposed with the second shield protrusion and second sensing region; and the at least one driver is connected to the second shield plate via the second connecting arm.

3. The thin-film-deposition equipment according to claim 2, further comprising a target facing the carrying surface of the carrier, wherein the first shield plate of the first shield member includes the surface disposed with the first shield protrusion and the first sensing region thereon facing the target; and the second shield plate of the second shield member includes the surface disposed with the second shield protrusion and the second sensing region thereon facing the target and disposed.

4. The thin-film-deposition equipment according to claim 3, wherein when in the shielding state, the first shield protrusion and the second shield protrusion approach each other to form an annular shield wall; and the first sensing region and the second sensing region approach each other to form an annular sensing region and that is disposed more radially-external than the annular shield wall is.

5. The thin-film-deposition equipment according to claim 4, further comprising a blocking member disposed within the containing space of the reaction chamber, the blocking member includes an end connected to the reaction chamber and includes another end formed with an opening, wherein the annular shield wall includes an inner diameter larger than a diameter of the opening.

6. The thin-film-deposition equipment according to claim 3, wherein each of the first shield protrusion and the second shield protrusion is tubular with a closed cross-section.

7. The thin-film-deposition equipment according to claim 3, wherein each of the first shield protrusion and the second shield protrusion is formed with an opened cross-section.

8. The thin-film-deposition equipment according to claim 7, wherein the first shield protrusion is connected to an edge of the first shield plate; and the second shield protrusion is connected to an edge of the second shield plate.

9. The thin-film-deposition equipment according to claim 2, further comprising:
    a first reflective surface disposed on the first connecting arm;
    a second reflective surface disposed on the second connecting arm;

a first distance sensor disposed on the reaction chamber for projecting a first optical beam onto the first reflective surface on the first connecting arm operated into the shielding state; and a second sensor disposed on the reaction chamber for projecting a second optical beam onto the second reflective surface on the second connecting arm operated into the shielding state.

10. The thin-film-deposition equipment according to claim 2, wherein the reaction chamber includes two sensor chambers respectively disposed with one of the at least two optical sensors, for respectively detecting the first sensing region of the first shield plate and the second sensing region of the second shield plate when the first shield plate and the second shield plate respectively enter the two sensor chambers.

11. The thin-film-deposition equipment according to claim 2, wherein the first shield plate of the first shield member includes a first inner surface formed with at least one protrusion; the second shield plate of the second shield member includes a second inner surface formed with at least one cavity, and the at least one protrusion of the first inner surface corresponds to the at least one cavity on the second inner surface; and in the shielding state, the first inner surface of the first shield plate and the second inner surface of the second shield plate are adjacent to each other, with the at least one protrusion on the first inner surface entering the at least one cavity on the second inner surface, the first shield plate and the second shield plate come together and shield the carrier.

12. The thin-film-deposition equipment according to claim 1, wherein each of the two optical sensors includes at least one optical emitter and at least one optical receiver; the optical emitters of the two optical sensors respectively project optical signals onto the first sensing region and the second sensing region, and the optical receivers of the two sensors respectively receive the optical signals reflected from the first sensing region and the second sensing region.

13. A shielding device, comprising:
a first shield plate including a first top surface, a first shield protrusion and a first sensing region, wherein the first shield protrusion and the first sensing region are disposed on the first top surface, and the first shield protrusion and the first sensing region are disposed adjacent to each other;

a second shield plate including a second top surface, a second shield protrusion and a second sensing region, wherein the second shield protrusion and the second sensing region are disposed on the second top surface, and the second protrusion and the second sensing region are disposed adjacent to each other; and at least one driver interconnecting the first shield plate and the second shield plate to respectively drive and swing the first shield plate and the second shield plate in opposite directions and switch between an open state and a shielding state; wherein in the shielding state, the first shield plate and the second shield plate approach each other; and wherein in the open state, the first shield plate and the second shield plate define an open space therebetween.

14. The shielding device according to claim 13, further comprising a first connecting arm and second connecting arm, wherein the at least one driver is connected to the first shield plate via the first connecting arm; and the at least one driver is connected to the second shield plate via the second connecting arm.

15. The shielding device according to claim 14, further comprising:
a first reflective surface disposed on the first connecting arm for reflecting a first optical beam projected by a first distance sensor; and;
a second reflective surface disposed on the second connecting arm for reflecting a second optical beam projected by a second distance sensor.

16. The shielding device according to claim 13, wherein when in the shielding state, the first shield protrusion and the second shield protrusion approach each other to form an annular shield wall; and the first sensing region and the second sensing region approach each other to form an annular sensing region that is disposed more radially-external than the annular shield wall is.

17. The shielding device according to claim 13, wherein each of the first shield protrusion and the second shield protrusion is tubular with a closed cross-section.

18. The shielding device according to claim 13, wherein each of the first shield protrusion and the second shield protrusion is formed with an opened cross-section.

19. The shielding device according to claim 18, wherein the first shield protrusion is connected to an edge of the first shield plate; and the second shield protrusion is connected to an edge of the second shield plate.

20. The shielding device according to claim 13, wherein the first shield plate of the first shield member includes a first inner surface formed with at least one protrusion; the second shield plate of the second shield member includes a second inner surface formed with at least one cavity, and the at least one protrusion of the first inner surface corresponds to the at least one cavity on the second inner surface; and in the shielding state, the first inner surface of the first shield plate and the second inner surface of the second shield plate are adjacent to each other, the at least one protrusion on the first inner surface enters the at least one cavity on the second inner surface.

* * * * *